(12) United States Patent
Kaseya et al.

(10) Patent No.: US 12,199,402 B2
(45) Date of Patent: Jan. 14, 2025

(54) LIGHT EMITTING DEVICE AND PROJECTOR

(71) Applicants: SEIKO EPSON CORPORATION, Tokyo (JP); SOPHIA SCHOOL CORPORATION, Tokyo (JP)

(72) Inventors: Hiroyasu Kaseya, Nagano Ken Suwa Gun Fujimi Machi (JP); Takafumi Noda, Nagano Ken Matsumoto (JP); Katsumi Kishino, Tokyo to Akiruno (JP)

(73) Assignees: SEIKO EPSON CORPORATION, Tokyo (JP); SOPHIA SCHOOL CORPORATION, Tokyo (JP)

( * ) Notice: Subject to any disclaimer, the term of this patent is extended or adjusted under 35 U.S.C. 154(b) by 733 days.

(21) Appl. No.: 17/389,361

(22) Filed: Jul. 30, 2021

(65) Prior Publication Data

US 2022/0037850 A1 Feb. 3, 2022

(30) Foreign Application Priority Data

Jul. 31, 2020 (JP) ................... 2020-129993

(51) Int. Cl.
*H01S 5/11* (2021.01)
*G03B 21/20* (2006.01)
*H01S 5/02* (2006.01)
*H01S 5/34* (2006.01)

(52) U.S. Cl.
CPC ........ *H01S 5/0218* (2013.01); *G03B 21/2033* (2013.01); *H01S 5/11* (2021.01); *H01S 5/341* (2013.01)

(58) Field of Classification Search
CPC .................................. H01S 5/11; H01S 5/341
See application file for complete search history.

(56) References Cited

U.S. PATENT DOCUMENTS

| 9,362,717 | B2* | 6/2016 | Kikuchi | ............ H01L 21/02458 |
| 2009/0137078 | A1 | 5/2009 | Asatsuma et al. | |
| 2011/0169025 | A1 | 7/2011 | Kishino et al. | |
| 2016/0013365 | A1* | 1/2016 | Chun | .................... H01L 33/007 438/34 |
| 2017/0301823 | A1 | 10/2017 | Svensson et al. | |

(Continued)

FOREIGN PATENT DOCUMENTS

| JP | 2004172506 | 6/2004 |
| JP | 2013239718 | 11/2013 |

(Continued)

*Primary Examiner* — Tod T Van Roy
*Assistant Examiner* — Fernanda Adriana Camacho Alanis
(74) *Attorney, Agent, or Firm* — JCIPRNET (57) ABSTRACT

A light emitting device includes a laminated structure having a plurality of columnar parts, wherein the columnar part includes a first semiconductor layer, a second semiconductor layer different in conductivity type from the first semiconductor layer, and a third semiconductor layer disposed between the first semiconductor layer and the second semiconductor layer, the third semiconductor layer includes a light emitting layer, and the second semiconductor layer includes a first portion, and a second portion which surrounds the first portion in a plan view from a laminating direction of the first semiconductor layer and the light emitting layer, and is lower in impurity concentration than the first portion.

11 Claims, 5 Drawing Sheets

(56) References Cited

U.S. PATENT DOCUMENTS

| | | | |
|---|---|---|---|
| 2018/0024433 A1 | 1/2018 | Komuro et al. | |
| 2020/0041889 A1* | 2/2020 | Ishizawa | H01S 5/423 |
| 2020/0106244 A1* | 4/2020 | Noda | H01S 5/3063 |
| 2020/0212253 A1 | 7/2020 | Michiue | |
| 2020/0313040 A1* | 10/2020 | Nishioka | G03B 21/2066 |
| 2021/0328096 A1 | 10/2021 | Michiue | |
| 2022/0278508 A1* | 9/2022 | Ishizawa | H01S 5/34333 |

FOREIGN PATENT DOCUMENTS

| | | |
|---|---|---|
| JP | 2016021556 | 2/2016 |
| JP | 2018013743 | 1/2018 |
| JP | 2018133517 | 8/2018 |
| JP | 2018137439 | 8/2018 |
| JP | 2020057640 | 4/2020 |
| JP | 2020107701 | 7/2020 |

\* cited by examiner

LIGHT EMITTING DEVICE AND PROJECTOR

The present application is based on, and claims priority from JP Application Serial Number 2020-129993, filed Jul. 31, 2020, the disclosure of which is hereby incorporated by reference herein in its entirety.

BACKGROUND

1. Technical Field

The present disclosure relates to a light emitting device and a projector.

2. Related Art

Semiconductor lasers are promised as high-luminance next-generation light sources. In particular, the semiconductor laser having a nano-structure called a nano-column, a nano-wire, a nano-rod, a nano-pillar, or the like is expected to realize a light emitting device capable of obtaining light emission narrow in radiation angle and high in power due to an effect of a photonic crystal.

For example, in JP-A-2013-239718, there is described a semiconductor photonic device array provided with a fine column crystal including an n-type cladding layer growing above a mask pattern, an active layer, and a p-type semiconductor layer.

In the semiconductor photonic element array provided with such nano-columns as described above, a crystal fault is apt to occur in a side surface of the nano-column. The crystal fault forms a leakage path of an electrical current between an n-type semiconductor layer and a p-type semiconductor layer in some cases.

SUMMARY

A light emitting device according to an aspect of the present disclosure includes a laminated structure having a plurality of columnar parts, wherein the columnar part includes a first semiconductor layer, a second semiconductor layer different in conductivity type from the first semiconductor layer, and a third semiconductor layer disposed between the first semiconductor layer and the second semiconductor layer, the third semiconductor layer includes a light emitting layer, and the second semiconductor layer includes a first portion, and a second portion which surrounds the first portion in a plan view from a laminating direction of the first semiconductor layer and the light emitting layer, and is lower in impurity concentration than the first portion.

A projector according to another aspect of the present disclosure includes the light emitting device according to the above aspect.

DESCRIPTION OF AN EXEMPLARY EMBODIMENT

A preferred embodiment of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. Light Emitting Device

Figure 1:
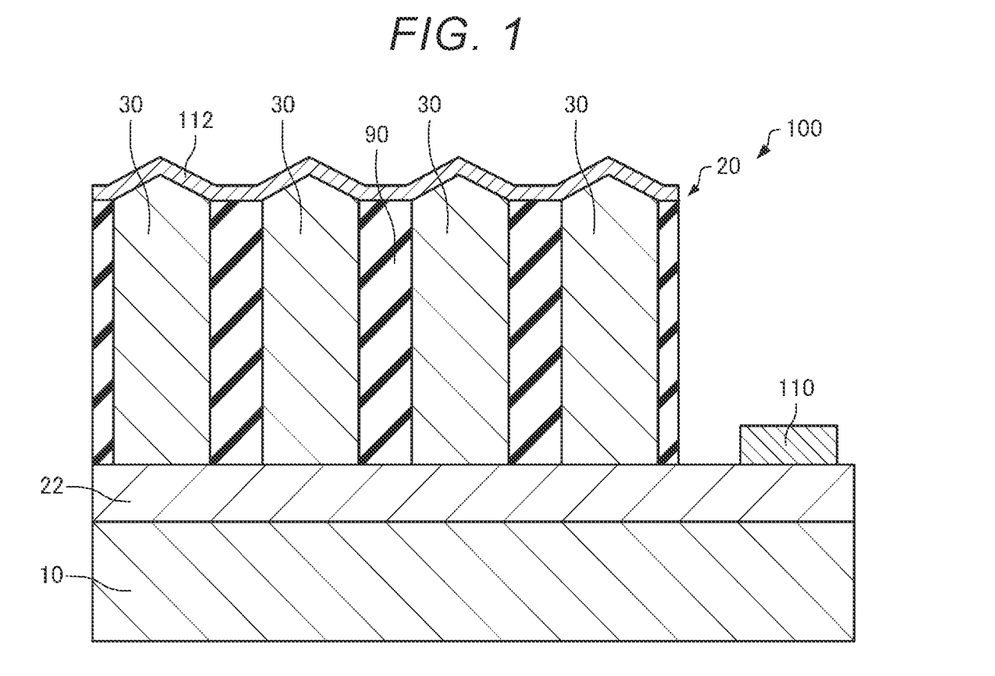
FIG. 1 is a cross-sectional view schematically showing the light emitting device according to the embodiment.
Figure 2:
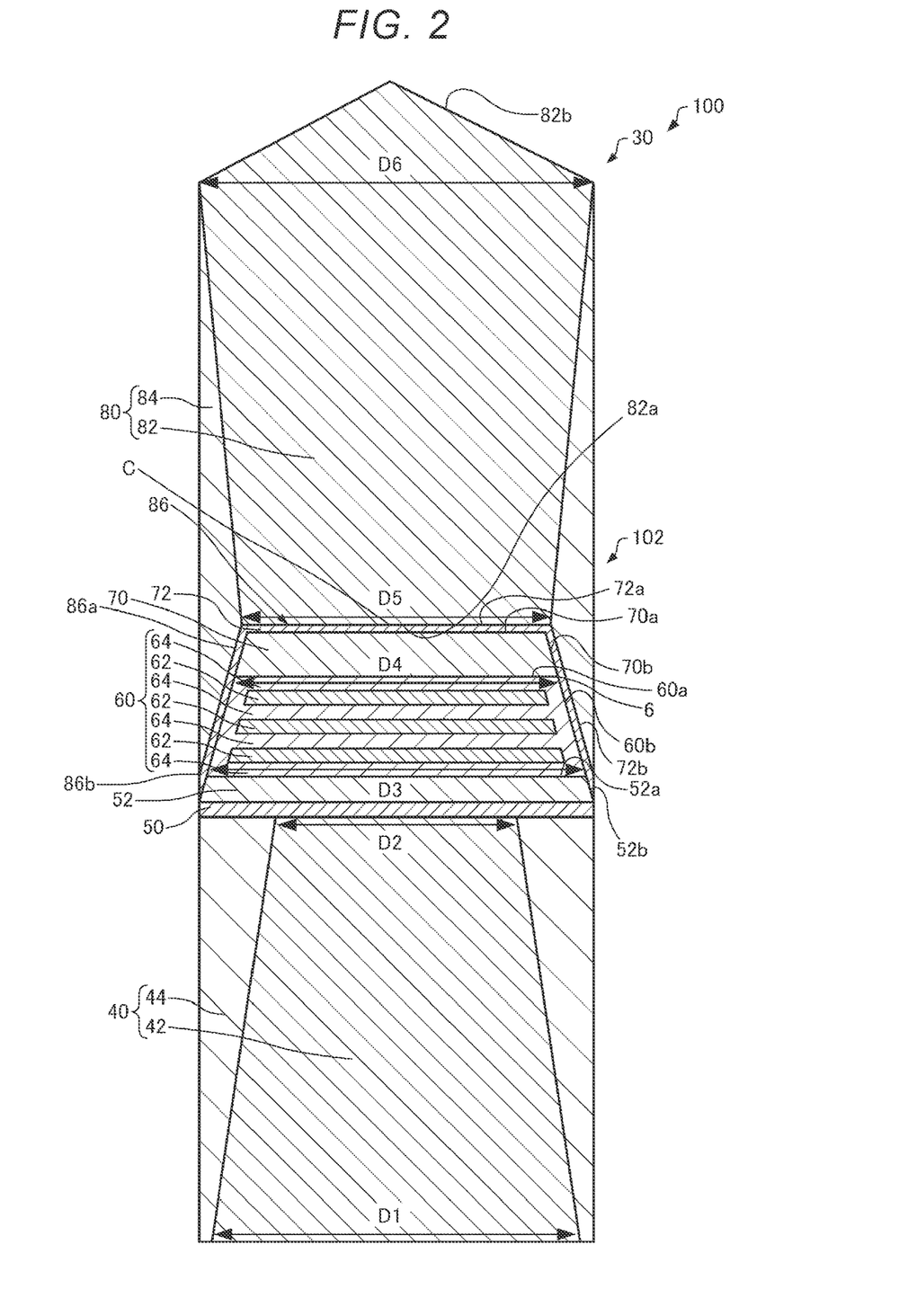
FIG. 2 is a cross-sectional view schematically showing a columnar part of the light emitting device according to the embodiment.

First, a light emitting device according to the present embodiment will be described with reference to the accompanying drawings. FIG. 1 is a cross-sectional view schematically showing the light emitting device 100 according to the present embodiment. FIG. 2 is a cross-sectional view schematically showing one of columnar parts 30 of the light emitting device 100 according to the present embodiment. It should be noted that in FIG. 1, the columnar parts 30 are illustrated in a simplified manner for the sake of convenience.

As shown in FIG. 1, the light emitting device 100 has, for example, a substrate 10, a laminated structure 20, a first electrode 110, and a second electrode 112.

The substrate 10 is, for example, an Si substrate, a GaN substrate, or a sapphire substrate.

The laminated structure 20 is provided to the substrate 10. The laminated structure 20 has a buffer layer 22, the columnar parts 30, and a light propagation layer 90.

The buffer layer 22 is disposed on the substrate 10. The buffer layer 22 is, for example, an Si-doped n-type GaN layer.

In the present specification, when taking the light emitting layer 60 as a reference in a laminating direction of a first semiconductor layer 40 and a light emitting layer 60 (hereinafter also referred to simply as a "laminating direction"), the description will be presented assuming a direction from the light emitting layer 60 toward a second semiconductor layer 80 as an "upward direction," and a direction from the light emitting layer 60 toward the first semiconductor layer 40 as a "downward direction." Further, a direction perpendicular to the laminating direction is also referred to as an "in-plane direction."

The buffer layer 22 is disposed on the substrate 10. The buffer layer 22 is, for example, an Si-doped n-type GaN layer. It should be noted that although not shown in the drawings, it is possible to dispose a mask layer for growing the columnar parts 30 on the buffer layer. The mask layer is, for example, a silicon oxide layer, a titanium layer, a titanium oxide layer, or an aluminum oxide layer.

The columnar parts 30 are disposed on the buffer layer 22. The columnar parts 30 each have a columnar shape protruding upward from the buffer layer 22. The columnar part 30 is also referred to as, for example, a nano-column, a nano-wire, a nano-rod, or a nano-pillar. A planar shape of the columnar part 30 is, for example, a polygon such as a regular hexagon, or a circle.

The diametrical size of the columnar part 30 is, for example, no smaller than 50 nm and no larger than 500 nm. By setting the diametrical size of the columnar part 30 to be no larger than 500 nm, it is possible to obtain the light emitting layer 60 made of crystals high in quality, and at the same time, it is possible to reduce a distortion inherent in the light emitting layer 60. Thus, it is possible to amplify light generated in the light emitting layer 60 with high efficiency. The columnar parts 30 are, for example, equal in diametrical size to each other.

It should be noted that when the planar shape of the columnar part 30 is a circle, the "diametrical size of the columnar part" means the diameter of the circle, and when the planar shape of the columnar part 30 is not a circular shape, the "diametrical size of the columnar part" means the diameter of the minimum bounding circle. For example, when the planar shape of the columnar part 30 is a polygonal shape, the diametrical size of the columnar part 30 is the diameter of a minimum circle including the polygonal shape inside, and when the planar shape of the columnar part 30 is an ellipse, the diametrical size of the columnar part 30 is the diameter of a minimum circle including the ellipse inside.

The number of the columnar parts 30 disposed is two or more. An interval between the columnar parts 30 adjacent to each other is, for example, no smaller than 1 nm and no larger than 500 nm. The columnar parts 30 are arranged at a predetermined pitch in a predetermined direction in a plan view from the laminating direction (hereinafter also referred to simply as "in the plan view"). The plurality of columnar parts 30 is arranged so as to form, for example, a triangular lattice. It should be noted that the arrangement of the plurality of columnar parts 30 is not particularly limited, and the plurality of columnar parts 30 can be arranged to form a square lattice. The plurality of columnar parts 30 can develop an effect of a photonic crystal.

It should be noted that the "pitch of the columnar parts" means a distance between the centers of the columnar parts 30 adjacent to each other along the predetermined direction. When the planar shape of the columnar part 30 is a circle, the "center of the columnar part" means the center of the circle, and when the planar shape of the columnar part 30 is not a circular shape, the "center of the columnar part" means the center of the minimum bounding circle. For example, when the planar shape of the columnar part 30 is a polygonal shape, the center of the columnar part 30 is the center of a minimum circle including the polygonal shape inside, and when the planar shape of the columnar part 30 is an ellipse, the center of the columnar part 30 is the center of a minimum circle including the ellipse inside.

As shown in FIG. 2, the columnar part 30 has, for example, the first semiconductor layer 40, the second semiconductor layer 80, and a third semiconductor layer 102. The third semiconductor layer 102 is formed of a plurality of semiconductor layers. The third semiconductor layer 102 has a first optical confinement layer (OCL) 50, a hole blocking layer (HBL) 52, a light emitting layer 60, a second optical confinement layer 70, and an electron blocking layer (EBL) 72.

The first semiconductor layer 40 is disposed on the buffer layer 22. The first semiconductor layer 40 is disposed between the substrate 10 and the light emitting layer 60. The first semiconductor layer 40 is an n-type semiconductor layer. The first semiconductor layer 40 is, for example, an Si-doped n-type GaN layer. The first semiconductor layer 40 has, for example, a high concentration part 42 and a low concentration part 44.

In the first semiconductor layer 40, an impurity concentration of the high concentration part 42 is higher than an impurity concentration of the low concentration part 44. A diametrical size D2 at the light emitting layer 60 side of the high concentration part 42 is smaller than, for example, a diametrical size D1 at an opposite side to the light emitting layer 60 of the high concentration part 42. The diametrical size D1 is a diametrical size in a portion the closest to the substrate 10 in the high concentration part 42. The diametrical size D1 is, for example, a diametrical size in a contact portion of the high concentration part 42 with the buffer layer 22. The diametrical size D2 is a diametrical size in a portion the closest to the light emitting layer 60 in the high concentration part 42. In the illustrated example, the diametrical size D2 is a diametrical size in a contact portion of the high concentration part 42 with the first optical confinement layer 50. A shape of the high concentration part 42 is, for example, a taper shape the diametrical size of which gradually decreases in a direction from the substrate 10 toward the light emitting layer 60. It should be noted that although not shown in the drawings, the diametrical size D2 can be the same as the diametrical size D1.

In the first semiconductor layer 40, the impurity concentration of the low concentration part 44 is lower than the impurity concentration of the high concentration part 42. The low concentration part 44 surrounds the high concentration part 42 in the plan view. The fact that the impurity concentration of the low concentration part 44 is lower than the impurity concentration of the high concentration part 42 can be confirmed by, for example, an atom probe analysis method.

The first optical confinement layer 50 is disposed on the first semiconductor layer 40. The first optical confinement layer 50 is disposed between the first semiconductor layer 40 and the light emitting layer 60. The first optical confinement layer 50 is, for example, an Si-doped n-type InGaN layer. When the first optical confinement layer 50 and a well layer 62 are each an InGaN layer, an atomic concentration (at %) of In in the first optical confinement layer 50 is lower than an atomic concentration of In in the well layer 62. The first optical confinement layer 50 is not limited to the InGaN layer, and can also be, for example, an AlGaN layer or an InAlGaN layer. The first optical confinement layer 50 is capable of reducing the light to be leaked from the light emitting layer 60 toward the first semiconductor layer 40.

The hole blocking layer 52 is disposed on the first optical confinement layer 50. The hole blocking layer 52 is disposed between the first semiconductor layer 40 and the light emitting layer 60. The hole blocking layer 52 has, for example, a c-plane 52a and a facet plane 52b. In the illustrated example, the c-plane 52a is an upper surface of the hole blocking layer 52. The facet plane 52b is a side surface of the hole blocking layer 52.

The hole blocking layer 52 is, for example, an Si-doped n-type InGaN layer. When the hole blocking layer 52 and the well layer 62 of the light emitting layer 60 are each an InGaN layer, an atomic concentration of In in the hole blocking layer 52 is lower than the atomic concentration of In in the well layer 62. The hole blocking layer 52 is capable of reducing the holes to be leaked from the light emitting layer 60 toward the first semiconductor layer 40.

It should be noted that although in the illustrated example, the hole blocking layer 52 is disposed on the first optical confinement layer 50, this is not a limitation, and it is possible to dispose the hole blocking layer 52 on the first semiconductor layer 40, and dispose the first optical confinement layer 50 on the hole blocking layer 52.

The light emitting layer 60 is disposed on the hole blocking layer 52. The light emitting layer 60 is disposed on the c-plane of the hole blocking layer 52. The light emitting layer 60 is disposed between the first semiconductor layer 40 and the second semiconductor layer 80. The light emitting layer 60 generates light in response to injection of an electrical current.

The light emitting layer 60 has the well layers 62 and barrier layers 64. The well layers 62 are each, for example, an i-type InGaN layer doped with no impurity. The number of the well layers 62 disposed is two or more. The barrier layers 64 are each, for example, an i-type GaN layer. The number of the barrier layers 64 disposed is two or more. The light emitting layer 60 has a multiple quantum well structure obtained by stacking quantum well structures each constituted by the well layer 62 and the barrier layer 64 on one another. In the illustrated example, the barrier layers 64 adjacent to each other are continuous in a peripheral part of the light emitting layer 60. The well layer 62 is surrounded by the barrier layer 64 in the plan view.

The light emitting layer 60 has a c-plane 60a and a facet plane 60b. In the illustrated example, the c-plane 60a is an upper surface of the light emitting layer 60. The facet plane 60b is a side surface of the light emitting layer 60. In the illustrated example, the c-plane 60a and the facet plane 60b are formed of the barrier layers 64.

A diametrical size D3 at the high concentration part 42 side of the light emitting layer 60 is larger than the diametrical size D2 at the light emitting layer 60 side of the high concentration part 42. The diametrical size D3 is a diametrical size in a portion the closest to the high concentration part 42 in the light emitting layer 60. In the illustrated example, the diametrical size D3 is a diametrical size in a contact portion of the light emitting layer 60 with the hole blocking layer 52.

The second optical confinement layer 70 is disposed on the light emitting layer 60. The second optical confinement layer 70 is disposed between the light emitting layer 60 and the second semiconductor layer 80. The second optical confinement layer 70 is disposed on the c-plane 60a of the light emitting layer 60. The second optical confinement layer 70 has a c-plane 70a and a facet plane 70b. In the illustrated example, the c-plane 70a is an upper surface of the second optical confinement layer 70. The facet plane 70b is a side surface of the second optical confinement layer 70.

The second optical confinement layer 70 is, for example, an Mg-doped p-type InGaN layer. When the second optical confinement layer 70 and the well layers 62 are each an InGaN layer, an atomic concentration of In in the second optical confinement layer 70 is lower than an atomic concentration of In in the well layer 62. The second optical confinement layer 70 is capable of reducing the light to be leaked from the light emitting layer 60 toward the second semiconductor layer 80. In the illustrated example, the shapes of the second optical confinement layer 70, the light emitting layer 60, and the hole blocking layer 52 are each a taper shape the diametrical size of which gradually decreases in a direction from the first semiconductor layer 40 toward a high concentration part 82 of the second semiconductor layer 80.

The electron blocking layer 72 is disposed on the second optical confinement layer 70. The electron blocking layer 72 is disposed between the light emitting layer 60 and the second semiconductor layer 80. In the illustrated example, the electron blocking layer 72 is disposed on the c-plane 70a and the facet plane 70b of the second optical confinement layer 70, the facet plane 60b of the light emitting layer 60, and the facet plane 52b of the hole blocking layer 52. The electron blocking layer 72 has a c-plane 72a and a facet plane 72b. In the illustrated example, the c-plane 72a is an upper surface of the electron blocking layer 72. The facet plane 72b is a side surface of the electron blocking layer 72. The c-planes 52a, 60a, 70a, and 72a are parallel to, for example, the upper surface of the substrate 10. The facet planes 52b, 60b, 70b, and 72b are tilted with respect to the upper surface of the substrate 10.

The electron blocking layer 72 is, for example, an Mg-doped p-type AlGaN layer. The electron blocking layer 72 is capable of reducing the electrons to be leaked from the light emitting layer 60 toward the second semiconductor layer 80.

The second semiconductor layer 80 is disposed on the electron blocking layer 72. The second semiconductor layer 80 is disposed between the light emitting layer 60 and the second electrode 112. The second semiconductor layer 80 is a semiconductor layer different in conductivity type from the first semiconductor layer 40. The second semiconductor layer 80 is a p-type semiconductor layer. The second semiconductor layer 80 is, for example, an Mg-doped p-type GaN layer. The first semiconductor layer 40 and the second semiconductor layer 80 are cladding layers having a function of confining the light in the light emitting layer 60. The second semiconductor layer 80 has the high concentration part 82 and a low concentration part 84.

In the second semiconductor layer 80, an impurity concentration of the high concentration part 82 is higher than an impurity concentration of the low concentration part 84. The high concentration part 82 is disposed on the c-plane 60a of the light emitting layer 60 via the second optical confinement layer 70 and the electron blocking layer 72. The high concentration part 82 is not disposed on the facet plane 60b of the light emitting layer 60. In the illustrated example, the high concentration part 82 is disposed on the c-plane 72a of the electron blocking layer 72. The high concentration part 82 is not disposed on the facet plane 72b of the electron blocking layer 72. A diametrical size D4 at the high concentration part 82 side of the light emitting layer 60 is larger than a diametrical size D5 at the light emitting layer 60 side of the high concentration part 82. The diametrical size D4 is a diametrical size in a portion the closest to the high concentration part 82 in the light emitting layer 60. In the illustrated example, the diametrical size D4 is a diametrical size in a contact portion of the light emitting layer 60 with the second optical confinement layer 70. The diametrical size D5 is a diametrical size in a portion the closest to the light emitting layer 60 in the high concentration part 82. In the illustrated example, the diametrical size D5 is a diametrical size in a contact portion of the high concentration part 82 with the electron blocking layer 72.

The high concentration part 82 of the second semiconductor layer 80 has a first surface 82a at the light emitting layer 60 side, and a second surface 82b at an opposite side to the light emitting layer 60. In the illustrated example, the first surface 82a is a contact surface of the high concentration part 82 with the electron blocking layer 72. The second surface 82b is, for example, a contact surface of the high concentration part 82 with the second electrode 112. The area of the second surface 82b is larger than the area of the first surface 82a. For example, when the planar shape of the columnar part 30 is a polygon, a diametrical size D6 of the minimum bounding circle of the second surface 82b is larger than the diametrical size D5 of the minimum bounding circle of the first surface 82a in the plan view.

In the second semiconductor layer 80, the impurity concentration of the low concentration part 84 is lower than the impurity concentration of the high concentration part 82. The low concentration part 84 surrounds the high concentration part 82 in the plan view. The low concentration part 84 is disposed on the facet plane 60b of the light emitting layer 60 via the electron blocking layer 72. The low concentration part 84 is not disposed on the c-plane 60a of the light emitting layer 60. In the illustrated example, the low concentration part 84 is disposed on the facet plane 72b of the electron blocking layer 72. The low concentration part 84 is not disposed on the c-plane 72a of the electron blocking layer 72. The fact that the impurity concentration of the low concentration part 84 is lower than the impurity concentration of the high concentration part 82 can be confirmed by, for example, the atom probe analysis method.

Figure 3:
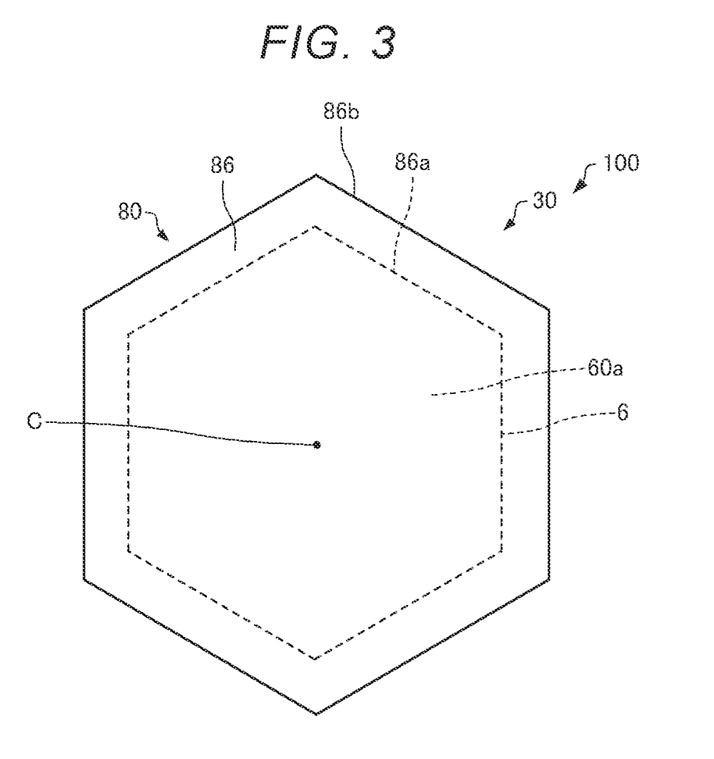
FIG. 3 is a plan view schematically showing the columnar part of the light emitting device according to the embodiment.

The second semiconductor layer 80 has a contact portion 86 having contact with the third semiconductor layer 102. In the illustrated example, the contact portion 86 of the second semiconductor layer 80 has contact with the electron blocking layer 72 of the third semiconductor layer 102. Here, FIG. 3 is a plan view schematically showing the columnar part 30. As shown in FIG. 3, in the plan view, for example, in the contact portion 86, an overlapping portion 86a overlapping an outer edge 6 of the c-plane 60a of the light emitting layer 60 is lower in impurity concentration than the center C of the contact portion 86. For example, the impurity concentration of an outer edge 86b of the contact portion 86 is lower than the impurity concentration at the center C of the contact portion 86. The c-plane 60a of the light emitting layer 60 is an end part at the second semiconductor layer 80 side of the light emitting layer 60. In the illustrated example, the c-plane 60a is the end part at the high concentration part 82 side of the light emitting layer 60.

In the light emitting device 100, a pin diode is constituted by, for example, the second semiconductor layer 80 of the p type, the electron blocking layer 72 of the p type, the second optical confinement layer 70 of the p type, the light emitting layer 60 of the i type, the hole blocking layer 52 of the n type, the first optical confinement layer 50 of the n type, and the first semiconductor layer 40 of the n type. In the light emitting device 100, when applying a forward bias voltage of the pin diode between the first electrode 110 and the second electrode 112, the electrical current is injected into the light emitting layer 60, and recombination of electrons and holes occurs in the light emitting layer 60. The recombination causes light emission. The light generated in the light emitting layer 60 propagates in an in-plane direction to form a standing wave due to the effect of the photonic crystal caused by the plurality of columnar parts 30, and is then gained by the light emitting layer 60 to cause laser oscillation. Then, the light emitting device 100 emits positive first-order diffracted light and negative first-order diffracted light as a laser beam in the laminating direction.

As shown in FIG. 1, the light propagation layer 90 is disposed between the columnar parts 30 adjacent to each other. In the plan view, the light propagation layer 90 is disposed around the columnar part 30. The light propagation layer 90 is, for example, a silicon oxide layer, an aluminum oxide layer, or a titanium oxide layer. The light generated in the light emitting layer 60 can pass through the light propagation layer 90 to propagate in the in-plain direction. It should be noted that an air gap can be disposed between the columnar parts 30 adjacent to each other without disposing the light propagation layer 90 although not shown in the drawings.

The first electrode 110 is disposed on the buffer layer 22. It is also possible for the buffer layer 22 to have ohmic contact with the first electrode 110. The first electrode 110 is electrically coupled to the first semiconductor layer 40. In the illustrated example, the first electrode 110 is electrically coupled to the first semiconductor layer 40 via the buffer layer 22. The first electrode 110 is one of the electrodes for injecting the electrical current into the light emitting layer 60. As the first electrode 110, there is used, for example, what is obtained by stacking a Cr layer, an Ni layer, and an Au layer in this order from the buffer layer 22 side.

The second electrode 112 is disposed on the second semiconductor layer 80. The second electrode 112 is electrically coupled to the second semiconductor layer 80. The second electrode 112 is the other of the electrodes for injecting the electrical current into the light emitting layer 60. As the second electrode 112, there is used, for example, ITO (indium tin oxide). It should be noted that although not shown in the drawings, a contact layer can also be disposed between the second semiconductor layer 80 and the second electrode 112. The contact layer is, for example, a p-type GaN layer.

It should be noted that although the light emitting layer 60 of the InGaN type is described above, as the light emitting layer 60, there can be used a variety of types of material system capable of emitting light in response to injection of an electrical current in accordance with the wavelength of the light to be emitted. It is possible to use semiconductor materials of, for example, an AlGaN type, an AlGaAs type, an InGaAs type, an InGaAsP type, an InP type, a GaP type, or an AlGaP type.

The light emitting device 100 can exert, for example, the following functions and advantages.

In the light emitting device 100, the second semiconductor layer 80 has the high concentration part (a first portion) 82, and a low concentration part (a second portion) 84 which surrounds the high concentration part 82 in the plan view, and is lower in impurity concentration than the high concentration part 82. Therefore, it is possible to reduce the electrical current on the side surface of the columnar part 30 where the crystal fault is apt to occur. Thus, it is possible to reduce the leakage of the electrical current between the first semiconductor layer 40 and the second semiconductor layer 80. As a result, in the light emitting device 100, it is possible to efficiently inject the electrical current into the light emitting layer 60.

In the light emitting device 100, in the contact portion 86 having contact with the third semiconductor layer 102 in the second semiconductor layer 80, the impurity concentration of the overlapping portion 86a overlapping the outer edge 6 of the c-plane 60a of the light emitting layer 60 in the plan view is lower than the impurity concentration at the center C of the contact portion 86, and the impurity concentration in the outer edge 86b of the contact portion 86 is lower than the impurity concentration at the center C of the contact portion 86. Therefore, in the light emitting device 100, it is possible to reduce the electrical current to be injected into the side surface formed of the facet plane 60b of the light emitting layer 60. Thus, it is possible to reduce the leakage of the electrical current between the first semiconductor layer 40 and the second semiconductor layer 80. The crystal fault is more apt to occur in the facet plane 60b of the light emitting layer 60 than in the c-plane 60a of the light emitting layer 60.

Figure 4:
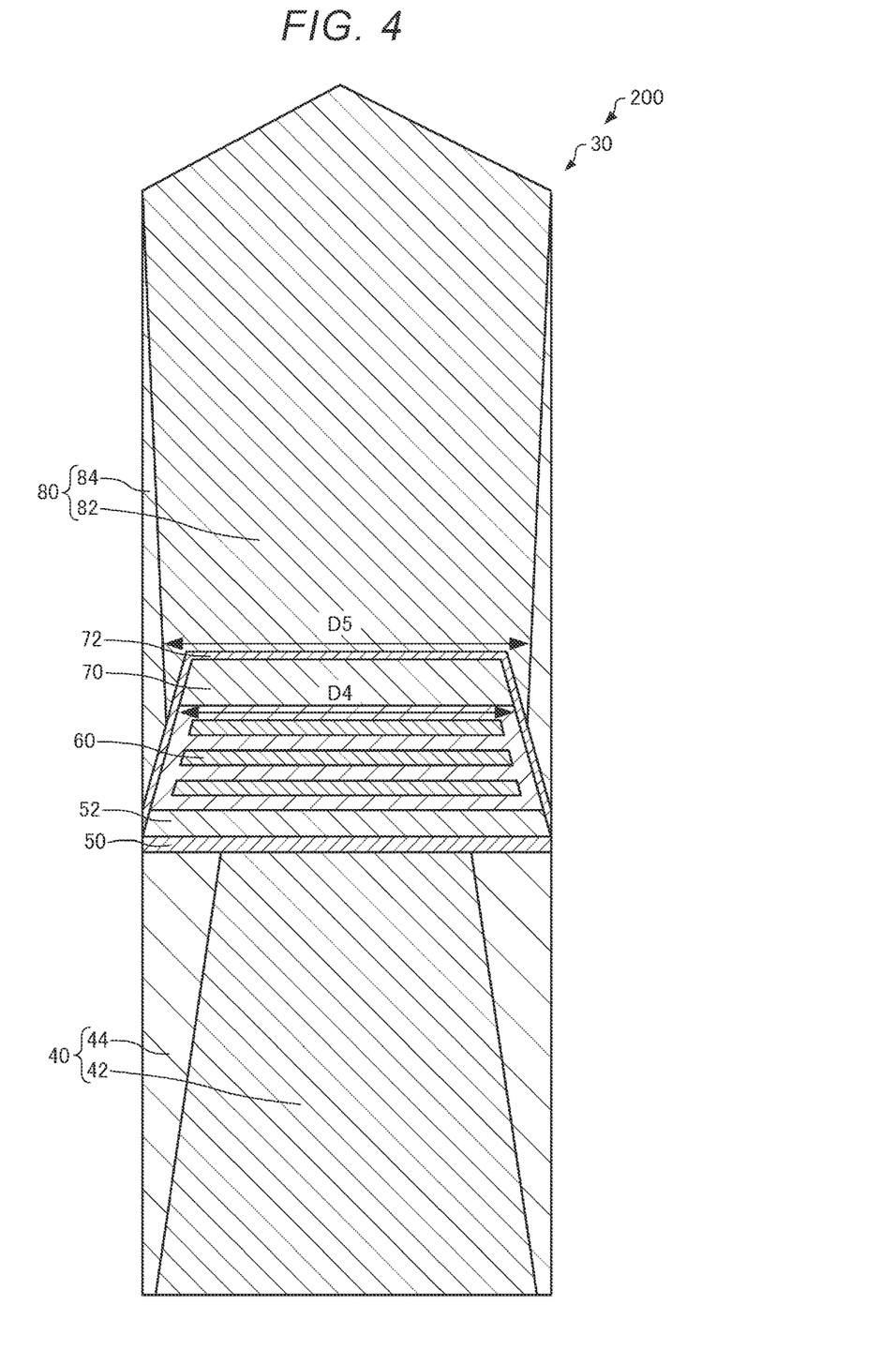
FIG. 4 is a cross-sectional view schematically showing a columnar part of a light emitting device according to a modified example of the embodiment.

In the light emitting device 100, the diametrical size D4 at the high concentration part 82 side of the light emitting layer 60 is larger than the diametrical size D5 at the light emitting layer 60 side of the high concentration part 82. Therefore, in the light emitting device 100, it is possible to prevent the high concentration part 82 which is low in resistance and through which the electrical current is apt to flow and the side surface formed of the facet plane 60b of the light emitting layer 60 from having contact with each other. Thus, in the light emitting device 100, it is possible to reduce the electrical current to be injected into the facet plane 60b of the light emitting layer 60 compared to when, for example, the diametrical size D4 at the high concentration part 82 side of the light emitting layer 60 is no larger than the diametrical size D5 at the light emitting layer 60 side of the high concentration part 82 as shown in FIG. 4. Thus, it is possible to reduce the leakage of the electrical current between the first semiconductor layer 40 and the second semiconductor layer 80. It should be noted that FIG. 4 is a cross-sectional view schematically showing one of the columnar parts 30 of a light emitting device 200 according to a modified example of the present embodiment.

In the light emitting device 100, the first semiconductor layer 40 has the high concentration part (a third portion) 42, and a low concentration part (a fourth portion) 44 which surrounds the high concentration part 42 in the plan view, and is lower in impurity concentration than the high concentration part 42. Therefore, in the light emitting device 100, it is possible to reduce the leakage of the electrical current between the first semiconductor layer 40 and the second semiconductor layer 80 compared to when the impurity concentration of the fourth portion is the same as the impurity concentration of the third portion.

In the light emitting device 100, the diametrical size D3 at the high concentration part 42 side of the light emitting layer 60 is larger than the diametrical size D2 at the light emitting layer 60 side of the high concentration part 42. Therefore, in the light emitting device 100, it is possible to reduce the leakage of the electrical current between the first semiconductor layer 40 and the second semiconductor layer 80 compared to when the diametrical size D3 is no larger than the diametrical size D2.

In the light emitting device 100, there is provided the second electrode 112 disposed on the laminated structure 20, the high concentration part 82 has the first surface 82a at the light emitting layer 60 side, and the second surface 82b at the second electrode 112 side, and the area of the second surface 82b is larger than the area of the first surface 82a. Therefore, in the light emitting device 100, it is possible to lower the contact resistance between, for example, the columnar parts 30 and the second electrode 112 compared to when the area of the second surface is no larger than the area of the first surface.

In the light emitting device 100, there is provided the hole blocking layer 52 disposed between the first semiconductor layer 40 and the light emitting layer 60, and the first semiconductor layer 40 is the n-type semiconductor layer, and the second semiconductor layer 80 is the p-type semiconductor layer. Therefore, in the light emitting device 100, it is possible to reduce the holes to be leaked from the light emitting layer 60 toward the first semiconductor layer 40.

In the light emitting device 100, the light emitting layer 60 has the c-plane 60a and the facet plane 60b, the high concentration part 82 is disposed on the c-plane 60a, and the low concentration part 84 is disposed on the facet plane 60b. Therefore, in the light emitting device 100, it is possible to reduce the leakage of the electrical current between the first semiconductor layer 40 and the second semiconductor layer 80 compared to when the high concentration part is disposed on the facet plane.

2. Method of Manufacturing Light Emitting Device

Figure 5:
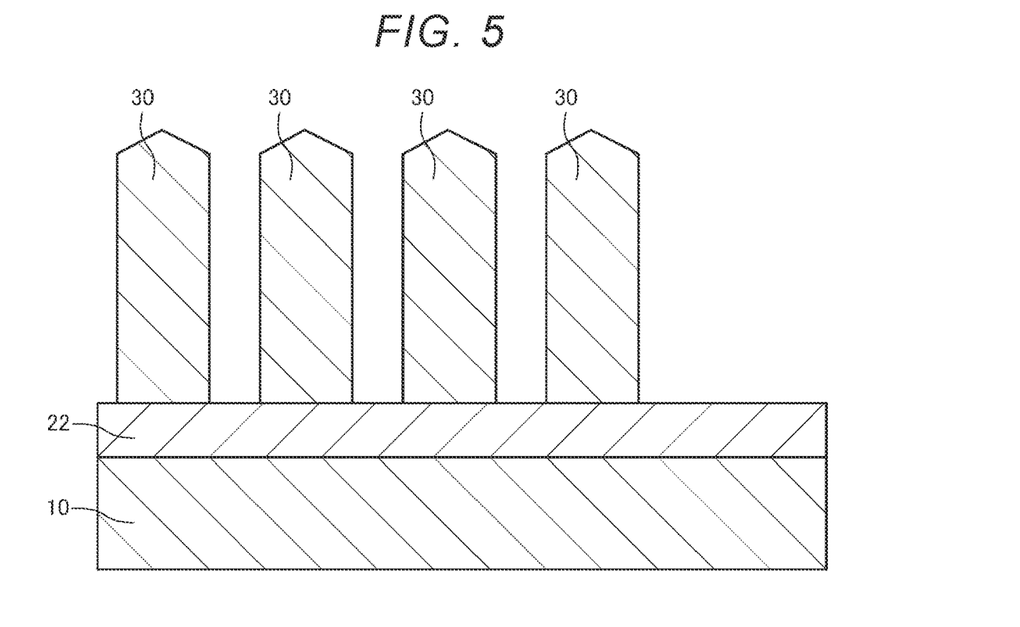
FIG. 5 is a cross-sectional view schematically showing a manufacturing process of the light emitting device according to the embodiment.

Then, a method of manufacturing the light emitting device 100 according to the present embodiment will be described with reference to the drawings. FIG. 5 is a cross-sectional view schematically showing the manufacturing process of the light emitting device 100 according to the present embodiment.

As shown in FIG. 5, the buffer layer 22 is grown epitaxially on the substrate 10. As the method of achieving the epitaxial growth, there can be cited, for example, an MOCVD (Metal Organic Chemical Vapor Deposition) method and an MBE (Molecular Beam Epitaxy) method.

Then, a mask layer not shown is formed on the buffer layer 22. The mask layer is formed using, for example, a sputtering method. When growing the columnar parts 30 using the MOCVD method, the mask layer is, for example, a silicon oxide layer. When growing the columnar parts 30 using the MBE method, the mask layer is, for example, a titanium layer. Then, opening parts are formed in the mask layer. The opening parts are formed by, for example, patterning using the photolithography process and the etching process.

Then, the columnar parts 30 are grown epitaxially on the buffer layer 22 using the mask layer as a mask. Specifically, as shown in FIG. 2, the first semiconductor layer 40, the first optical confinement layer 50, the hole blocking layer 52, the light emitting layer 60, the second optical confinement layer 70, the electron blocking layer 72, and the second semiconductor layer 80 are grown epitaxially. As the method of achieving the epitaxial growth, there can be cited, for example, the MOCVD method and the MBE method.

The growth of the first semiconductor layer 40 is performed while adjusting, for example, the deposition temperature and the deposition speed so that the low concentration part 44 surrounds the high concentration part 42 in the plan view. The impurity concentration of the first semiconductor layer 40 is apt to be higher in a central portion compared to a rim portion. Further, the growth of the first semiconductor layer 40 is performed while adjusting, for example, the deposition temperature and the deposition speed so that the diametrical size D2 becomes smaller than the diametrical size D1.

The growth of the hole blocking layer 52 is performed while adjusting, for example, the deposition temperature and the deposition speed so that the hole blocking layer 52 is provided with the c-plane 52a and the facet plane 52b.

The growth of the light emitting layer 60 is performed while adjusting, for example, the deposition temperature and the deposition speed so that the barrier layer 64 surrounds the well layer 62 in the plan view. Further, the growth of the light emitting layer 60 is performed while adjusting, for example, the deposition temperature and the deposition speed so that the light emitting layer 60 is provided with the c-plane 60a and the facet plane 60b, and the diametrical size D4 becomes larger than the diametrical size D3.

The growth of the second optical confinement layer 70 is performed while adjusting, for example, the deposition temperature and the deposition speed so that the second optical confinement layer 70 is provided with the c-plane 70a and the facet plane 70b.

The growth of the electron blocking layer 72 is performed while adjusting, for example, the deposition temperature and the deposition speed so that the electron blocking layer 72 is provided with the c-plane 72a and the facet plane 72b.

The growth of the second semiconductor layer 80 is performed while adjusting, for example, the deposition temperature and the deposition speed so that the low concentration part 84 surrounds the high concentration part 82 in the plan view. The impurity concentration of the second semiconductor layer 80 is apt to be higher in a central portion compared to a rim portion. Further, the growth of the second semiconductor layer 80 is performed while adjusting, for example, the deposition temperature and the deposition speed so that the diametrical size D6 becomes larger than the diametrical size D5.

As shown in FIG. 1, the light propagation layer 90 is formed between the columnar parts 30 adjacent to each other. The light propagation layer 90 is formed using, for example, a spin coat method, or a CVD (Chemical Vapor Deposition) method.

Then, the second electrode 112 is formed on the second semiconductor layer 80. Then, the first electrode 110 is formed on the buffer layer 22. The first electrode 110 and the second electrode 112 are formed using, for example, a vacuum vapor deposition method. It should be noted that the order of forming the first electrode 110 and the second electrode 112 is not particularly limited.

Due to the process described hereinabove, it is possible to manufacture the light emitting device 100.

It should be noted that although not shown in the drawings, it is possible to form a portion having the columnar parts 30 on the substrate 10, then remove the substrate 10, and then mount the portion having the columnar parts 30 on another substrate. It is possible for the portion having the columnar parts 30 to be constituted by the columnar parts 30, the light propagation layer 90, and the second electrode 112, and further include the buffer layer 22 and the first electrode 110.

3. Projector

Figure 6:
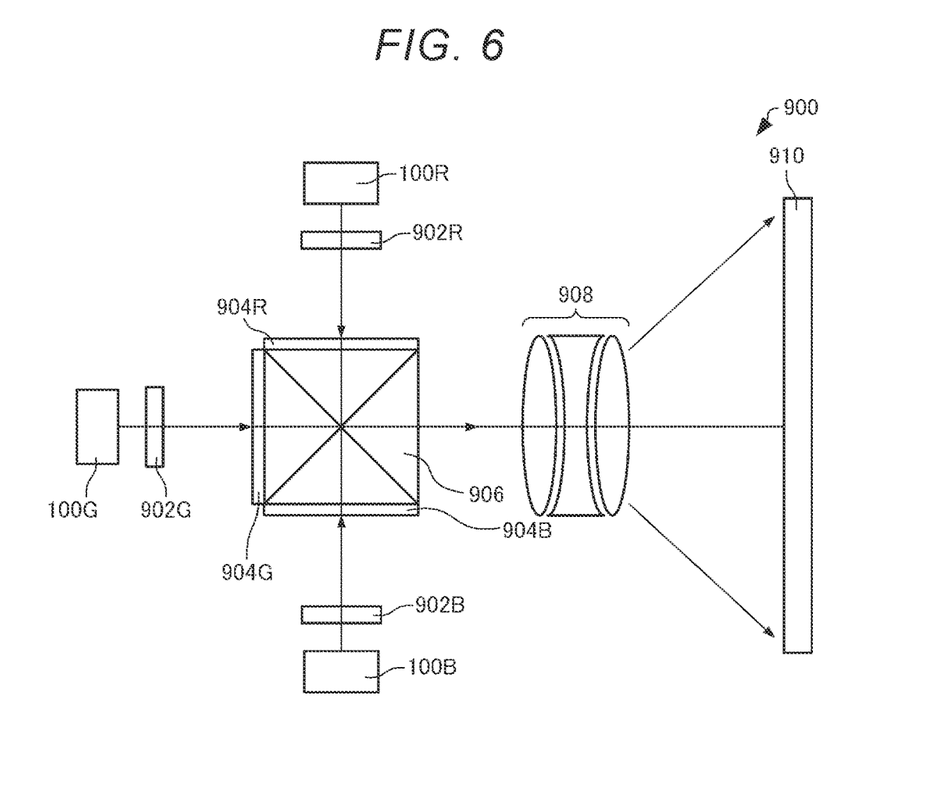
FIG. 6 is a diagram schematically showing a projector according to the embodiment.

Then, a projector according to the present embodiment will be described with reference to the drawings. FIG. 6 is a diagram schematically showing the projector 900 according to the present embodiment.

The projector 900 has, for example, the light emitting device 100 as a light source.

The projector 900 includes a housing not shown, a red light source 100R, a green light source 100G, and a blue light source 100B which are disposed inside the housing, and respectively emit red light, green light, and blue light. It should be noted that in FIG. 6, the red light source 100R, the green light source 100G, and the blue light source 100B are simplified for the sake of convenience.

The projector 900 further includes a first optical element 902R, a second optical element 902G, a third optical element 902B, a first light modulation device 904R, a second light modulation device 904G, a third light modulation device 904B, and a projection device 908 all installed inside the housing. The first light modulation device 904R, the second light modulation device 904G, and the third light modulation device 904B are each, for example, a transmissive liquid crystal light valve. The projection device 908 is, for example, a projection lens.

The light emitted from the red light source 100R enters the first optical element 902R. The light emitted from the red light source 100R is collected by the first optical element 902R. It should be noted that the first optical element 902R can be provided with other functions than the light collection. The same applies to the second optical element 902G and the third optical element 902B described later.

The light collected by the first optical element 902R enters the first light modulation device 904R. The first light modulation device 904R modulates the incident light in accordance with image information. Then, the projection device 908 projects an image formed by the first light modulation device 904R on a screen 910 in an enlarged manner.

The light emitted from the green light source 100G enters the second optical element 902G. The light emitted from the green light source 100G is collected by the second optical element 902G.

The light collected by the second optical element 902G enters the second light modulation device 904G. The second light modulation device 904G modulates the incident light in accordance with the image information. Then, the projection device 908 projects an image formed by the second light modulation device 904G on the screen 910 in an enlarged manner.

The light emitted from the blue light source 100B enters the third optical element 902B. The light emitted from the blue light source 100B is collected by the third optical element 902B.

The light collected by the third optical element 902B enters the third light modulation device 904B. The third light modulation device 904B modulates the incident light in accordance with the image information. Then, the projection device 908 projects an image formed by the third light modulation device 904B on the screen 910 in an enlarged manner.

Further, it is possible for the projector 900 to include a cross dichroic prism 906 for combining the light emitted from the first light modulation device 904R, the light emitted from the second light modulation device 904G, and the light emitted from the third light modulation device 904B with each other to guide the light thus combined to the projection device 908.

The three colors of light respectively modulated by the first light modulation device 904R, the second light modulation device 904G, and the third light modulation device 904B enter the cross dichroic prism 906. The cross dichroic prism 906 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 910 by the projection device 908, and thus, an enlarged image is displayed.

It should be noted that it is possible for the red light source 100R, the green light source 100G, and the blue light source 100B to directly form the images by controlling the light emitting devices 100 as the pixels of the image in accordance with the image information without using the first light modulation device 904R, the second light modulation device 904G, and the third light modulation device 904B. Then, it is also possible for the projection device 908 to project the images formed by the red light source 100R, the green light source 100G, and the blue light source 100B on the screen 910 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device for scanning the surface of the screen with the light from the light source to thereby display an image with a desired size on the display surface.

The light emitting devices according to the embodiment described above can also be used for other devices than projectors. As the applications other than projectors, there can be cited, for example, a light source of indoor and outdoor illumination, a backlight for a display, a laser printer, a scanner, an in-car light, sensing equipment using light, communication equipment, and so on.

The present disclosure includes configurations substantially the same as the configuration described as the embodiment, for example, configurations having the same function, the same way, and the same result, or configurations having the same object and the same advantage. Further, the present disclosure includes configurations obtained by replacing a non-essential part of the configuration described as the embodiment. Further, the present disclosure includes configurations providing the same functions and advantages, and configurations capable of achieving the same object as those of the configuration described as the embodiment. Further, the present disclosure includes configurations obtained by adding known technologies to the configuration described as the embodiment.

The following contents derive from the embodiment and the modified examples described above.

A light emitting device according to an aspect includes a laminated structure having a plurality of columnar parts, wherein the columnar part includes a first semiconductor layer, a second semiconductor layer different in conductivity type from the first semiconductor layer, and a third semiconductor layer disposed between the first semiconductor layer and the second semiconductor layer, the third semiconductor layer has a light emitting layer, and the second semiconductor layer includes a first portion, and a second portion which surrounds the first portion in a plan view from a laminating direction of the first semiconductor layer and the light emitting layer, and is lower in impurity concentration than the first portion.

According to this light emitting device, it is possible to reduce the electrical current on the side surface of the columnar part where the crystal fault is apt to occur. Thus, it is possible to reduce the leakage of the electrical current between the first semiconductor layer and the second semiconductor layer. As a result, it is possible to efficiently inject the current into the light emitting layer.

In the light emitting device according to the aspect, in a contact portion having contact with the third semiconductor layer in the second semiconductor layer, an impurity concentration in a portion overlapping an outer edge of an end part at the second semiconductor layer side of the light emitting layer in the plan view from the laminating direction may be lower than an impurity concentration at a center of the contact portion, and an impurity concentration in an outer edge of the contact portion may be lower than the impurity concentration at the center of the contact portion.

According to this light emitting device, it is possible to reduce the electrical current to be injected into the side surface formed of the facet plane of the light emitting layer. Thus, it is possible to reduce the leakage of the electrical current between the first semiconductor layer and the second semiconductor layer. The crystal fault is more apt to occur in the facet plane of the light emitting layer than in the c-plane of the light emitting layer.

In the light emitting device according to the aspect, a diametrical size at the first portion side of the light emitting layer may be larger than a diametrical size at the light emitting layer side of the first portion.

According to this light emitting device, it is possible to prevent the first portion which is low in resistance and through which the electrical current is apt to flow, and the side surface of the light emitting layer from having contact with each other. Therefore, it is possible to reduce the electrical current injected into the side surface of the light emitting layer. Thus, it is possible to reduce the leakage of the electrical current between the first semiconductor layer and the second semiconductor layer.

In the light emitting device according to the aspect, the first semiconductor layer may include a third portion, and a fourth portion which surrounds the third portion in the plan view from the laminating direction of the first semiconductor layer and the light emitting layer, and is lower in impurity concentration than the third portion.

According to the light emitting device, it is possible to reduce the leakage of the electrical current between the first semiconductor layer and the second semiconductor layer compared to when the impurity concentration of the fourth portion is the same as the impurity concentration of the third portion.

In the light emitting device according to the aspect, a diametrical size at the light emitting layer side of the third portion may be larger than a diametrical size at an opposite side to the light emitting layer of the third portion.

According to this light emitting device, it is possible to increase a difference between an average refractive index in the in-plane direction in the first semiconductor layer and an average refractive index in the in-plane direction in an active layer compared to when the diametrical size of the third portion is constant (constant at the diametrical size at the opposite side to the light emitting layer in the laminating direction). Thus, it is possible to further confine the light in the active layer.

In the light emitting device according to the aspect, a diametrical size at the third portion side of the light emitting layer may be larger than a diametrical size at the light emitting layer side of the third portion.

According to this light emitting device, it is possible to reduce the leakage of the electrical current between the first semiconductor layer and the second semiconductor layer compared to when the diametrical size at the third portion side of the light emitting layer is no larger than the diametrical size at the light emitting layer side of the third portion.

In the light emitting device according to the aspect, there may further be included an electrode provided to the laminated structure, wherein the second semiconductor layer may be disposed between the light emitting layer and the electrode.

In the light emitting device according to the aspect, the first portion may include a first surface at the light emitting layer side and a second surface at the electrode side, and an area of the second surface may be larger than an area of the first surface.

According to this light emitting device, it is possible to lower the contact resistance between, for example, the columnar parts and the second electrode compared to when the area of the second surface is no larger than the area of the first surface.

In the light emitting device according to the aspect, there may further be included a hole blocking layer disposed between the first semiconductor layer and the light emitting layer, wherein the first semiconductor layer may be an n-type semiconductor layer, and the second semiconductor layer may be a p-type semiconductor layer.

According to this light emitting device, it is possible to reduce the holes leaking from the light emitting layer toward the first semiconductor layer.

In the light emitting device according to the aspect, the light emitting layer may have a c-plane and a facet plane, the first portion may be disposed on the c-plane, and the second portion may be disposed on the facet plane.

According to this light emitting device, it is possible to reduce the leakage of the electrical current between the first semiconductor layer and the second semiconductor layer compared to when the first portion is disposed on the facet plane.

A projector according to another aspect includes the light emitting device according to the above aspect.

What is claimed is:

1. A light emitting device comprising:
a substrate; and
a laminated structure having a plurality of columnar parts, wherein
the columnar part includes
a first semiconductor layer,
a second semiconductor layer different in conductivity type from the first semiconductor layer, and
a third semiconductor layer disposed between the first semiconductor layer and the second semiconductor layer,
the third semiconductor layer includes a light emitting layer, and
the second semiconductor layer includes
a first portion, and
a second portion which surrounds the first portion in a plan view from a laminating direction of the first semiconductor layer and the light emitting layer, and is lower in impurity concentration than the first portion, wherein
the first semiconductor layer, the light emitting layer and the second semiconductor layer are disposed in this order from the substrate.

2. The light emitting device according to claim 1, wherein in a contact portion having contact with the third semiconductor layer in the second semiconductor layer, an impurity concentration in a portion overlapping an outer edge of an end part at a second semiconductor layer side of the light emitting layer in the plan view from the laminating direction is lower than an impurity concentration at a center of the contact portion, and an impurity concentration in an outer edge of the contact portion is lower than the impurity concentration at the center of the contact portion.

3. The light emitting device according to claim 1, wherein a diametrical size at a first portion side of the light emitting layer is larger than a diametrical size at a light emitting layer side of the first portion.

4. The light emitting device according to claim 3, wherein the first semiconductor layer includes
a third portion, and
a fourth portion which surrounds the third portion in the plan view from the laminating direction, and is lower in impurity concentration than the third portion.

5. The light emitting device according to claim 4, wherein a diametrical size at a light emitting layer side of the third portion is smaller than a diametrical size at an opposite side to the light emitting layer of the third portion.

6. The light emitting device according to claim 4, wherein a diametrical size at a third portion side of the light emitting layer is larger than a diametrical size at a light emitting layer side of the third portion.

7. The light emitting device according to claim 1, further comprising:
an electrode provided to the laminated structure, wherein the second semiconductor layer is disposed between the light emitting layer and the electrode.

8. The light emitting device according to claim 7, wherein the first portion includes a first surface at the light emitting layer side and a second surface at the electrode side, and
an area of the second surface is larger than an area of the first surface.

9. The light emitting device according to claim 1, further comprising:
a hole blocking layer disposed between the first semiconductor layer and the light emitting layer, wherein
the first semiconductor layer is an n-type semiconductor layer, and
the second semiconductor layer is a p-type semiconductor layer.

10. The light emitting device according to claim 1, wherein
the light emitting layer has a c-plane and a facet plane,
the first portion is disposed on the c-plane, and
the second portion is disposed on the facet plane.

11. A projector comprising:
the light emitting device according to claim 1.

* * * * *